(12) United States Patent
Kim

(10) Patent No.: US 8,766,687 B2
(45) Date of Patent: Jul. 1, 2014

(54) SEMICONDUCTOR MEMORY DEVICE AND OPERATING METHOD THEREOF

(75) Inventor: Kwan-Dong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 4 days.

(21) Appl. No.: 13/608,150

(22) Filed: Sep. 10, 2012

(65) Prior Publication Data
US 2013/0088271 A1 Apr. 11, 2013

(30) Foreign Application Priority Data
Oct. 5, 2011 (KR) .................. 10-2011-0101313

(51) Int. Cl.
H03L 7/06 (2006.01)
(52) U.S. Cl.
USPC .......................................... 327/158; 375/376
(58) Field of Classification Search
USPC ............................ 327/141–163; 375/354–376
See application file for complete search history.

(56) References Cited

U.S. PATENT DOCUMENTS

| 6,249,160 | B1 * | 6/2001 | Tagami et al. | 327/165 |
| 7,142,621 | B2 * | 11/2006 | Vallet et al. | 375/355 |
| 7,542,533 | B2 * | 6/2009 | Jasa et al. | 375/354 |
| 2006/0267646 | A1 * | 11/2006 | Tan et al. | 327/156 |
| 2007/0121772 | A1 * | 5/2007 | Wada | 375/371 |

FOREIGN PATENT DOCUMENTS

KR 1020080021212 3/2008

* cited by examiner

*Primary Examiner* — Lincoln Donovan
*Assistant Examiner* — Thomas Skibinski
(74) *Attorney, Agent, or Firm* — IP & T Group LLP

(57) ABSTRACT

A semiconductor memory device includes a clock period reflector configured to reflect time corresponding to period information of an internal clock signal to an input data signal, a data-clock converter configured to generate a synchronization clock signal having phases corresponding to an output signal of the clock period reflector, and a synchronization output unit configured to synchronize and output the input data signal in response to the synchronization clock signal.

12 Claims, 6 Drawing Sheets

SEMICONDUCTOR MEMORY DEVICE AND OPERATING METHOD THEREOF

CROSS-REFERENCE TO RELATED APPLICATIONS

The present application claims priority of Korean Patent Application No. 10-2011-0101313, filed on Oct. 5, 2011, which is incorporated herein by reference in its entirety.

BACKGROUND

1. Field

Exemplary embodiments of the present invention relate to a semiconductor design technology, and more particularly, to a semiconductor memory device and an operating method thereof capable of performing several operations by receiving clock signals and data signals.

2. Description of the Related Art

Generally, a semiconductor memory device including a double data rate synchronous DRAM (DDR SDRM) receives clock signals and data signals from an external controller to perform operations such as reading and writing, or the like. In this case, the external controller transfers the clock signals and the data signals together with strobe signals used to synchronize the clock signals and the data signals. However, the method may cause a skew between the clock signals and the data signals and suffer various types of external noises, so that it may be difficult to secure a stable operation of the semiconductor memory device. Therefore, a clock data recovery method has been recently used.

The clock data recovery method includes recovering the clock signals from the data signals and thus, the external controller does not transfer the separate data strobe signals. Therefore, the clock data recovery method may not include a configuration for transferring the data strobe signals required in the related art and may not consider various types of noises reflected in the data strobe signals.

However, in order to secure a margin in which the clock signals and the data signals are synchronized with each other, the clock data recovery method may require a delay circuit for simply delaying the clock signals or the data signals by a given time within the circuit and reflect the undesired noises to the clock signals and the data signals due to the delay configuration.

SUMMARY

An embodiment of the present invention is directed to a semiconductor memory device which is capable of delaying data signals by using control signals used in generating of internal clock signals to thereby generate internal clock signals by using the delayed data signals.

In accordance with an embodiment of the present invention, semiconductor memory device may includes: a clock period reflector configured to reflect time corresponding to period information of an internal clock signal to an input data signal; a data-clock converter configured to generate a synchronization clock signal having phases corresponding to an output signal of the clock period reflector; and a synchronization output unit configured to synchronize and output the input data signal in response to the synchronization clock signal.

The clock period reflector may delay the input data signal by the time corresponding to the period information and outputs the delayed input data signal.

In accordance with another embodiment of the present invention, a method for operating a semiconductor memory device includes: generating an internal clock signal by controlling delayed amount according to a delay control signal; delaying an input data signal by time corresponding to the delay control signal; generating a synchronization clock signal corresponding to an activated edge of an output signal at the delaying; and synchronizing the input data signal in response to the synchronization clock signal.

The input data signal may be delayed by time smaller than the time corresponding to one period of the internal clock signal.

The semiconductor memory device according to the exemplary embodiment of the present invention delays the data signals by using the control signals used to generate the internal clock signals to synchronize the input data signals using the generated internal clock signals, thereby sufficiently securing the margin of the input data signals and the internal clock signals.

DETAILED DESCRIPTION

Hereinafter, exemplary embodiments of the present invention will be described with reference to the accompanying drawings so that a person with an ordinary skilled in the art to which the present invention pertains can easily carry out technical ideas of the present invention.

Figure 1:
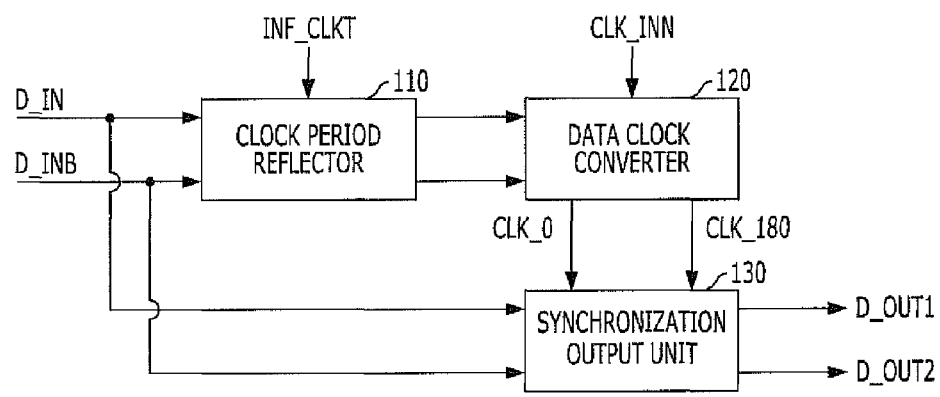
FIG. 1 is a block diagram for describing some components of a semiconductor memory device in accordance with an embodiment of the present invention.

FIG. 1 is a block diagram for describing some components of a semiconductor memory device in accordance with an embodiment of the present invention.

Referring to FIG. 1, a semiconductor memory device includes a clock period reflector 110, a data-clock converter 120, and a synchronization output unit 130.

The clock period reflector 110 is to reflect time corresponding to clock period information INT_CLKT to positive/negative input data signals D_IN and D_INB to output the reflected input data signals. That is, the clock period reflector 110 serves to delay the positive/negative input data signals D_IN and D_INB by the time corresponding to the clock period information INF_CLINT to output the delayed data signals. Herein, the clock period information INT_CLKT means information on a period of the internal clock signal to be described hereinafter. The clock period reflector 110 may delay, for example, positive/negative input data signals D_IN and D_INB by time corresponding to, for example, ½ and ¼ of one period of the internal clock signal. For reference, although the embodiment of FIG. 1 shows the case in which the clock period reflector 110 differentially receives the positive/negative input data signals D_IN and D_INB, i.e., the data signal, this may be changed according to a design.

The data-clock converter 120 generates first and second synchronization clock signals CLK_0 and CLK_180 having a phase corresponding to the output signals for the clock period reflector 110 and the synchronization output unit 130 synchronizes and outputs the positive/negative data signals D_IN and D_INB with the first and second synchronization clock signals CLK_0 and CLK_180. Herein, the first and second synchronization clock signals CLK_0 and CLK_180 are signals to output the consecutively input positive/negative input data signals D_IN and D_INB at a rising edge and a falling edge of a clock. Therefore, the embodiment of the present invention shows an example in which the first synchronization clock signal CLK_0 and the second synchronization output signal CLK_180 has a phase difference in 180°.

Figure 2:
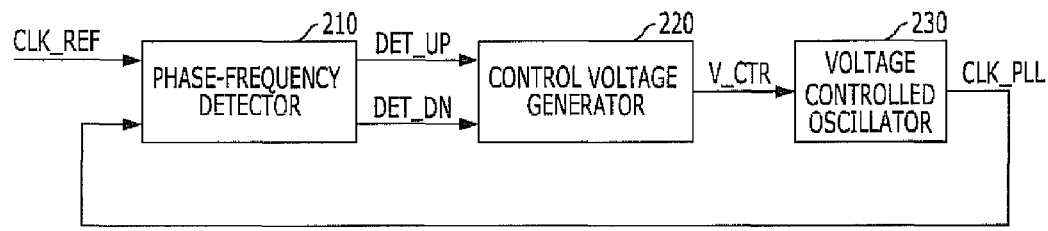
FIG. 2 is a block diagram for describing an internal clock signal generator that generates a clock period information shown in FIG. 1.

FIG. 2 is a block diagram for describing an internal clock signal generator that generates clock period information INF_CLKT shown in FIG. 1.

Referring to FIG. 2, the internal clock signal generator includes a phase-frequency detector 210, a control voltage generator 220, and a voltage controlled oscillator 230.

The phase-frequency detector 210 detects a phase-frequency of a reference clock signal CLK-REF and a PLL clock signal CLK_PLL having a frequency corresponding to external clock signals with an up detection signal DET_UP and a down detection signal DET_DN and the control voltage generator 220 generates control voltage V_CTR having a voltage level corresponding to the up detection signal DET_UP and the down detection signal DET_DN. Then, the voltage controlled oscillator 230 generates the internal clock signal of the frequency, i.e., a PLL clock signal CLK_PLL that corresponds to the voltage level of the control voltage V_CTR.

Herein, the control voltage V_CTR has information corresponding to one period of the PLL clock signal CLK_PLL, wherein the control voltage V_CTR becomes the clock period information INF_CLKT.

Figure 3:
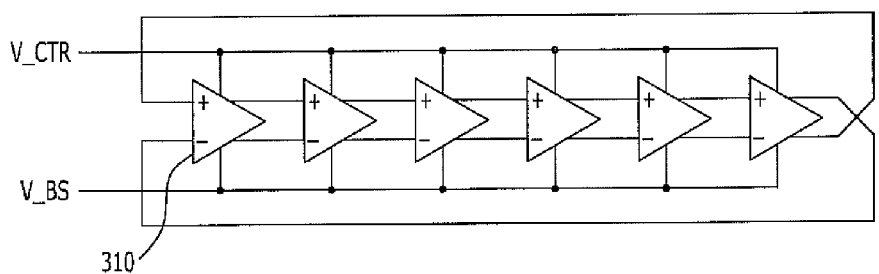
FIG. 3 is a circuit diagram for describing a voltage controlled oscillator 230 of FIG. 2.

FIG. 3 is a circuit diagram for describing a voltage controlled oscillator 230 shown in FIG. 2.

Referring to FIG. 3, the voltage controlled oscillator 230 includes a plurality of delay units 310 that receives the control voltage V_CTR and bias voltage V_BS and has the delay time corresponding to the control voltage V_CTR. Herein, the bias voltage V_BS is voltage having a given voltage level.

Figure 4:
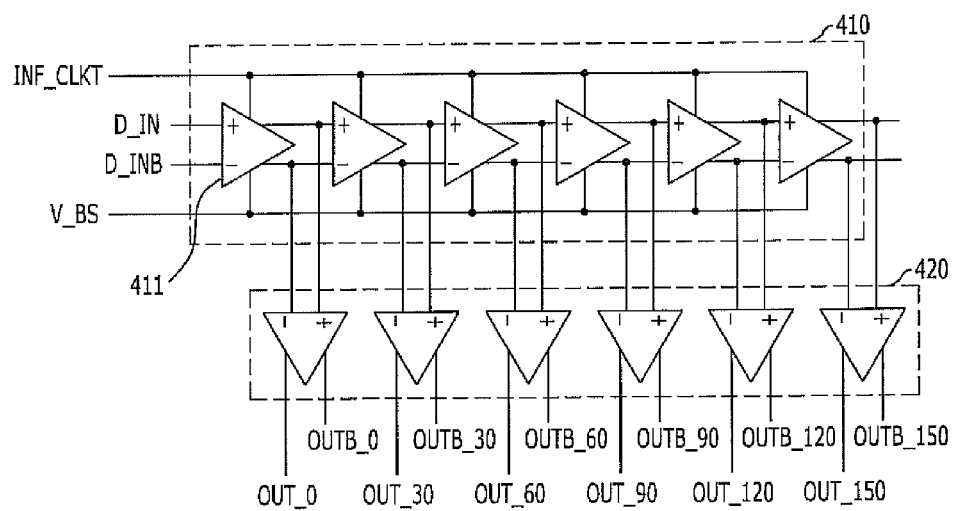
FIG. 4 is a circuit diagram for describing a clock period reflector shown in FIG. 1.

FIG. 4 is a circuit diagram for describing a clock period reflector 110 shown in FIG. 1.

Referring to FIG. 4, the clock period reflector 110 includes a plurality of delay units 410 and an output unit 420.

The plurality of delay units 410 receives the clock period information INF_CLKT and the bias voltage V_B to have the delay time corresponding to the clock period information INF_CLKT. Herein, each of the plurality of delay units 410 models each of the plurality of delay units including the delay unit 310 of FIG. 3. Next, the output unit 420 outputs the output signal of the desired delay unit among the output signal of the plurality of delay units 410 to the data-clock converter 120 of FIG. 1.

The plurality of delay unit 410 of the clock period reflector 110 receives the control voltage V_CTR as the clock period information INF_CLKT. Therefore, each of the plurality of delay units 410 of the clock period reflector 110 has the delay time corresponding to each of the plurality of delay units of the voltage controlled oscillator 230. Consequently, signals 'OUT_30' and 'OUTB_30' among the output signal of the output unit 420 become signals delaying the positive/negative input data signals D_IN and D_INB by time corresponding to 30° based on one period of the PLL clock signal CLK_PLL. Similarly, signals 'OUT_60' and 'OUTB_60' among the output signal of the output unit 420 become signals delaying the positive/negative input data signals D_IN and D_INB by time corresponding to 60° based on one period of the PLL clock signal CLK_PLL.

Hereinafter, for the illustrative purpose, the embodiment of the present invention describes signals 'OUT_90' and 'OUTB_90' as an example.

Figure 5:
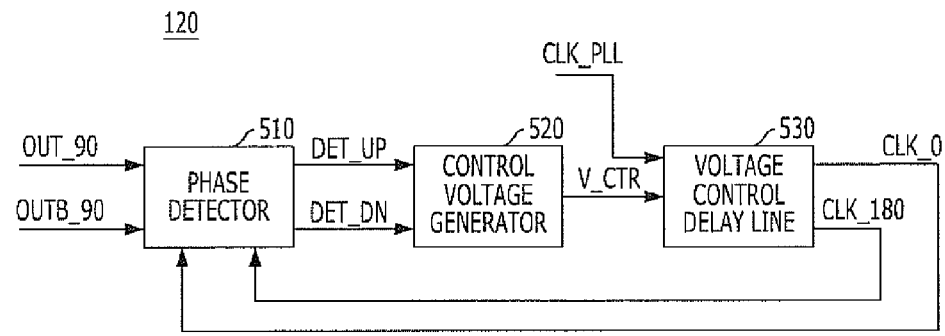
FIG. 5 is a block diagram for describing a data-clock converter shown in FIG. 1.

FIG. 5 is a block diagram for describing a data-clock converter 120 shown in FIG. 1.

Referring to FIG. 5, the data-clock converter 120 includes a phase detector 510, a control voltage generator 520, and a voltage control delay line 530.

The phase detector 510 detects the signals 'OUT_90' and 'OUTB_90' output from the clock period reflector 110 and the phase of the first and second synchronization clock signals CLK_0 and CLK_180 with the up detection signal DET_UP and the down detection signal DET_DN and the control voltage generator 520 generates the control voltage V_CTR having the voltage level corresponding to the up detection signal DET_UP and the down detection signal DET_DN. Then, the voltage control delay line 530 delays the PLL clock signal CLK_PLL by the time corresponding to the control voltage V_CTR and outputs the delayed PLL clock signal CLK_PLL to the first and second synchronization clock signals CLK_0 and CLK_180.

Figure 6:
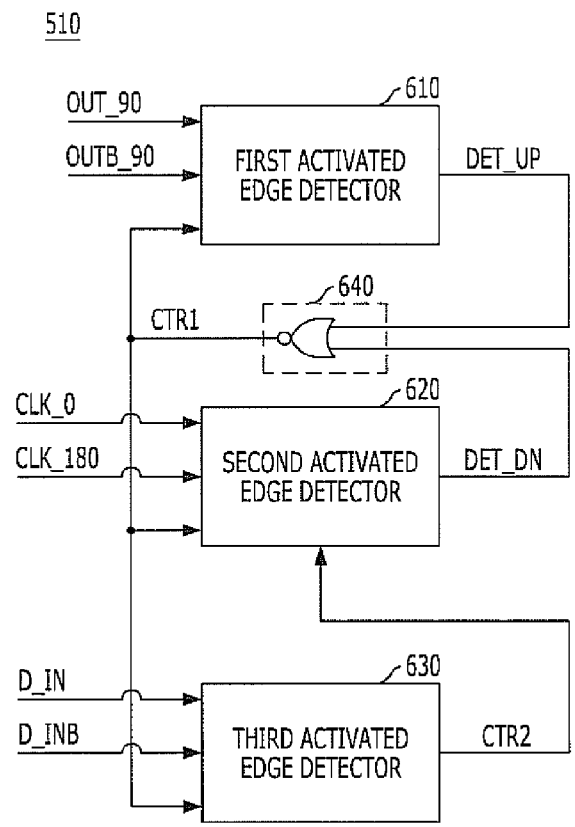
FIG. 6 is a block diagram for describing a phase detector shown in FIG. 5.

FIG. 6 is a block diagram for describing a phase detector 510 shown in FIG. 5.

Referring to FIG. 6, the phase detector 510 includes a first activated edge detector 610, a second activated edge detector 620, a third activated edge detector 630, and a period setting unit 640.

The first activated edge detector 610 detects the activated edges of the signals 'OUT_90' and 'OUTB_90' output from the clock period reflector 110 to generate the up detection signal DET_UP, the second activated edge detector 620 detects the activated edges of the signals 'CLK_O' and 'CLK_180' to generate the down detection signal DET_DN, the third activated edge detector 630 detects the activated edges of the positive/negative input data signals D_IN and D_INB to generate a second control signal CTR2, and the period setting unit 640 sums the up detection signal DET_UP and the down detection signal DET_DN to generate the first control signal CTR1.

In this case, the first to third activated edge detectors 610, 620, and 630 are set/reset for a period defined by the first control signal CTR1 and the second activated edge detector 620 is reset in response to the second control signal CTR2 of the third activated edge detector 630.

Figure 7:
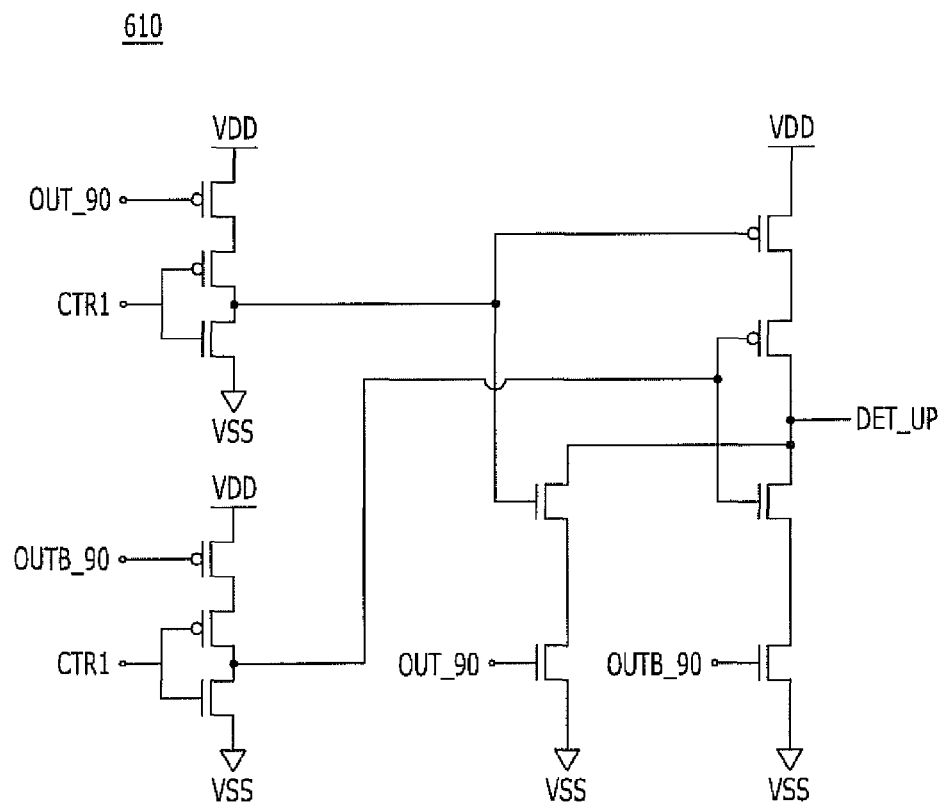
FIGS. 7 and 8 are a circuit diagram and an operating waveform diagram for describing a first active edge detector shown in FIG. 6.
Figure 8:
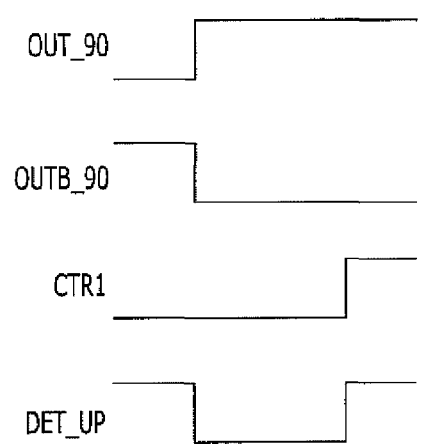

FIGS. 7 and 8 are a circuit diagram and an operating waveform diagram for describing a first active edge detector 610 of FIG. 6.

As can be appreciated in FIGS. 7 and 8, when the first control signal CTR1 is logic 'low' level, the up detection signal DET_UP is shifted from logic 'high' level to logic 'low' level in response to the activated edges of the signals 'OUT_90' and 'OUTB_90' and when the first control signal CTR1 is shifted from logic 'low' level to logic 'high' level, the up detection signal DET_UP is shifted from logic 'low' level to logic 'high' level.

For reference, the third activated edge detector 630 of FIG. 6 has a configuration similar to the first activated edge detector 610 disclosed in FIG. 7. That is, the third activated edge detector 630 inputs the positive and negative input data signals D_IN and D_INB instead of the signals 'OUT_90' and 'OUTB_90' and outputs the second control signal CRT2 instead of the up detection signal DET_UP.

Figure 9:
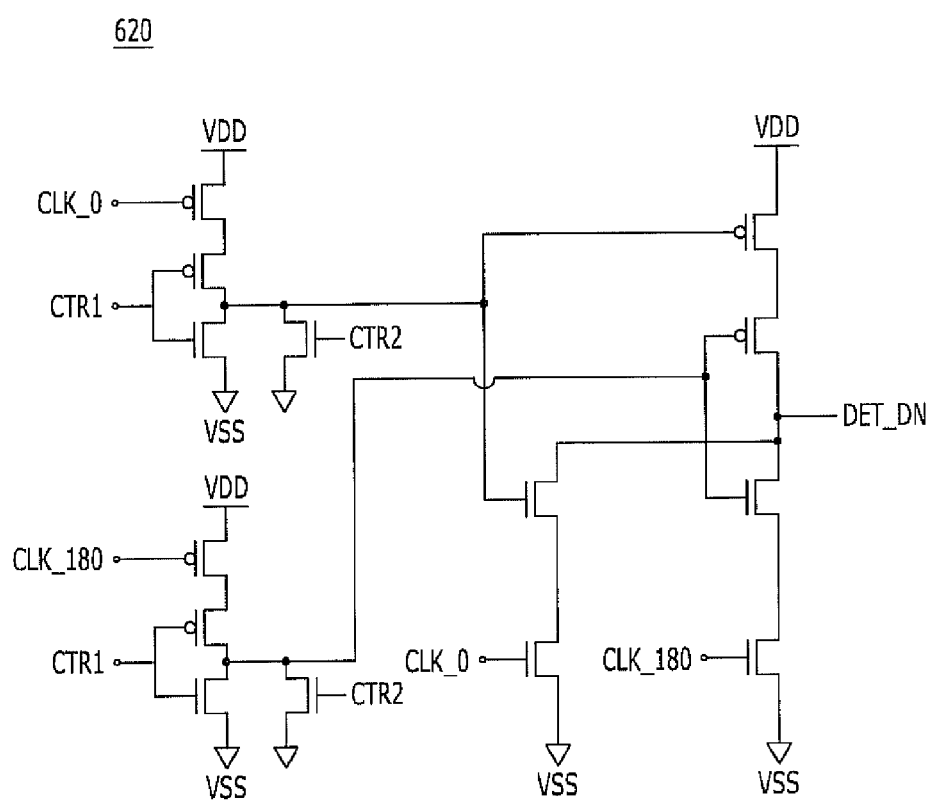
FIG. 9 is a circuit diagram for describing a second activated edge detector shown in FIG. 6.

FIG. 9 is a circuit diagram for describing a second activated edge detector 620 of FIG. 6. The second activated edge detector 620 of FIG. 9 is similar to a circuit configuration and a circuit operation of the first activated edge detector 610. That is, the second activated edge detector 620 inputs the first and second synchronization signals CLK_O and CLK_180 instead of the signals 'OUT_90' and 'OUTB_90' of FIG. 7 and outputs the down detection signal DET_DN instead of the up detection signal DET_UP. Further, an NMOS transistor receiving the second control signal CTR2 to reset the down detection signal DET_DN is further provided.

Figure 10:
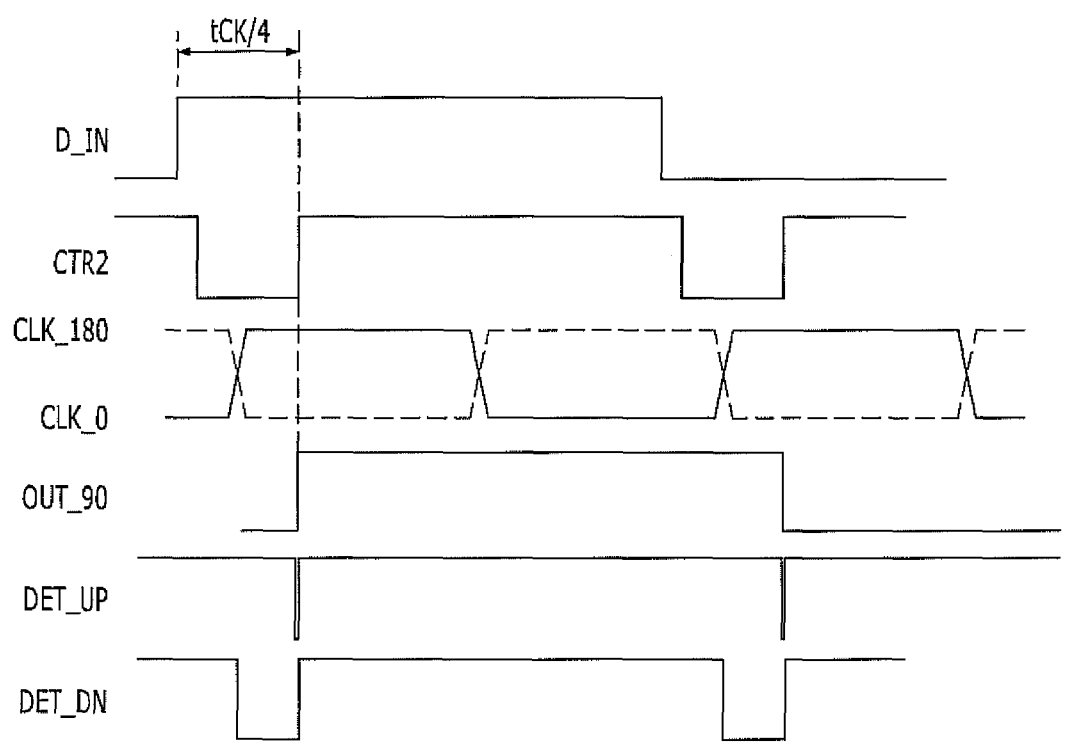
FIG. 10 is an operating waveform diagram for describing a circuit operation of the phase detector shown in FIG. 6.

FIG. 10 is an operating waveform diagram for describing a circuit operation of the phase detector 510 of FIG. 6.

Referring to FIG. 10, the up detection signal DET_UP detects the activated edge of the signal 'OUT_90' and the down detection signal DET_DN detects the first and second synchronization clock signals CLK_0 and CLK_180. Referring back to FIG. 5, the up detection signal DET_UP and the down detection signal DET_DN that are generated as described above are input to the control voltage generator 520. In this case, the control voltage generator 520 generates the control voltage V_CTR in response to the input up detection signal DET_UP and down detection signal DET_DN. Further, the voltage control delay line 530 delays the PLL clock signal CLK_PLL by the time corresponding to the control voltage V_CTR to generate the first and second synchronization clock signals CLK_0 and CLK_180. Then, the phase detector 510 again receives the first and second synchronization clocks signals CLK_0 and CLK_180 to generate the up detection signal DET_UP and the down detection signal DET_DN. The operation is performed until the pulse widths of the up detection signal DET_UP and the down detection signal DET_DN are the same, such that the first and second synchronization clock signals CLK_0 and CLK_180 are delayed corresponding to the activated edge of the 'OUT_90' signal.

Referring back to FIG. 1, the synchronization output unit 130 transfers the positive/negative input data signals D_IN and D_INB in response to the delayed first synchronization clock signal CLK_0 as the first output data signal D_OUT1 and transfers the positive/negative input data signals D_IN and D_INB in response to the delayed second synchronization clock signal CLK_180 as the second output data signal D_OUT2.

As described above, the semiconductor memory device in accordance with the embodiment of the present invention may not require the existing strobe signals and since the first and second synchronization clock signals CLK_0 and CLK_180 and the positive/negative input data D_IN and D_INB have the sufficient margin, the stability and reliability of the semiconductor memory device may be increased.

As set forth above, the exemplary embodiments of the present invention can increase the stability and reliability of the semiconductor memory device by sufficiently securing the margin of the input data signals and the internal clock signals.

While the present invention has been described with respect to the specific embodiments, it will be apparent to those skilled in the art that various changes and modifications may be made without departing from the spirit and scope of the invention as defined in the following claims.

Further, the position and type of the logical gate and the transistor illustrated in the aforementioned embodiments may be differently implemented according to the polarity of the input signals.

What is claimed is:

1. A semiconductor memory device, comprising:
a clock period reflector configured to reflect a time corresponding to period information of an internal clock signal to an input data signal;
a data-clock converter configured to generate a synchronization clock signal having phases corresponding to an output signal of the clock period reflector; and
a synchronization output unit configured to synchronize and output the input data signal in response to the synchronization clock signal,
wherein the data-clock converter includes:
 a phase detector configured to detect the phase of the output signal of the clock period reflector and the synchronization clock signal;
 a control voltage generator configured to generate a control voltage corresponding to an output signal of the phase detector; and
 a voltage control delay line configured to delay the internal clock signal by a time corresponding to the control voltage to generate the synchronization clock signal.

2. The semiconductor memory device of claim 1, wherein the clock period reflector is configured to delay the input data signal by the time corresponding to the period information to output a delayed input data signal.

3. The semiconductor memory device of claim 1, wherein the input data signal is delayed by a time smaller than a time corresponding to one period of the internal clock signal.

4. The semiconductor memory device of claim 1, further comprising: an internal clock signal generator configured to generate the internal clock signal to generate the period information corresponding to the internal clock signal.

5. The semiconductor memory device of claim 4, wherein the internal clock signal generator includes:
a phase-frequency detector configured to detect a phase-frequency of a reference clock signal corresponding to an external clock signal and the internal clock signal;
a control voltage generator configured to generate a control voltage corresponding to the output signal of the phase-frequency detector; and
a voltage controlled oscillator configured to generate the internal clock signal of the frequency corresponding to the control voltage.

6. The semiconductor memory device of claim 5, wherein the period information corresponds to the control voltage.

7. The semiconductor memory device of claim 5, wherein the control voltage generator further includes a plurality of delay units having a delay time corresponding to the control voltage.

8. The semiconductor memory device of claim 7, wherein the clock period reflector is configured to model the delay units.

9. The semiconductor memory device of claim 1, wherein the clock period reflector includes:
a plurality of delay units configured to have a delay time corresponding to the period information; and
an output unit configured to output an output signal of a corresponding delay unit among the plurality of delay units to the data-clock converter.

10. The semiconductor memory device of claim 1, wherein the phase detector includes:

a first activated edge detector configured to detect an activated edge of the output signal of the clock period reflector; and
a second activated edge detector configured to detect the activated edge of the synchronization clock signal.

11. The semiconductor memory device of claim 10, wherein the first and second activated edge detectors are configured to set/reset for a period defined by output signals of the first activated edge detector and the second activated edge detector.

12. The semiconductor memory device of claim 11, further comprising:
a third activated edge detector configured to generate a reset signal by detecting the activated edge of the input data signal,
wherein the second activated edge detector is reset in response to the reset signal.

* * * * *